United States Patent [19]

Nagai et al.

[11] Patent Number: 5,095,489
[45] Date of Patent: Mar. 10, 1992

[54] SEMICONDUCTOR LASER DEVICE

[75] Inventors: Yutaka Nagai; Kenji Ikeda, both of Itami, Japan

[73] Assignee: Mitsubishi Denki Kabushiki Kaisha, Japan

[21] Appl. No.: 585,900

[22] Filed: Sep. 21, 1990

[30] Foreign Application Priority Data

Oct. 5, 1989 [JP] Japan .................. 1-260739

[51] Int. Cl.⁵ .................. H01S 3/19; H01S 3/082
[52] U.S. Cl. .................. 372/49; 372/31; 372/46; 372/99; 372/108
[58] Field of Search .................. 372/99, 108, 98, 18, 372/19, 44, 45, 46, 49, 31

[56] References Cited

U.S. PATENT DOCUMENTS

| | | | |
|---|---|---|---|
| 4,426,707 | 1/1984 | Masitia et al. | 372/95 |
| 4,744,088 | 5/1988 | Heinen et al. | 372/50 |
| 4,764,929 | 8/1988 | Thaniyavarn | 372/18 |
| 4,791,650 | 12/1988 | Tatsuno et al. | 372/50 |
| 4,805,176 | 2/1989 | Botez et al. | 372/29 |
| 4,870,649 | 9/1989 | Bobeck et al. | 372/19 |
| 4,942,588 | 7/1990 | Yasui et al. | 372/103 |
| 4,972,427 | 11/1990 | Streifer et al. | 372/92 |

OTHER PUBLICATIONS

Matsumoto et al., "Single-Lobed Far-Field . . . Shifter", Applied Physics Letters 50(22), 1987, pp. 1541-1543.

Primary Examiner—William L. Sikes
Assistant Examiner—Galen J. Hansen
Attorney, Agent, or Firm—Leydig, Voit & Mayer

[57] ABSTRACT

A semiconductor laser device having a pair of cavity facets provided confronting to each other and conducting a laser oscillation at wavelength λ, includes a reflection film having a reflectivity $R_1$ against a laser light of wavelength λ provided on one of cavity facets among the pair of cavity facets, and partial reflection films having a reflectivity $R_2$ higher than the reflectivity $R_1$ against laser light of wavelength λ, provided at a plurality of portions of the laser oscillation regions in parallel with each other on the reflection film. Therefore, a semiconductor laser device in which the active layer emits light uniformly without arising filamentation is obtained.

11 Claims, 6 Drawing Sheets

POSITION →

← FRONT FACET　REAR FACET →

SEMICONDUCTOR LASER DEVICE

METHOD OF THE INVENTION

The present invention relates to a semiconductor laser device, and more particularly to a broad-area type semiconductor laser device capable of high power light output.

BACKGROUND OF THE INVENTION

A semiconductor laser device is used as a light source for the excitation of a solid-state laser device, such as Nd:YAG (Neodymium: Yttrium Aluminum Garnet) or GGG (Gadolinium Gallium Garnet) laser. This is because a semiconductor laser device is superior in size and reliability to a flash lamp which has been conventionally used.

Figure 2A:
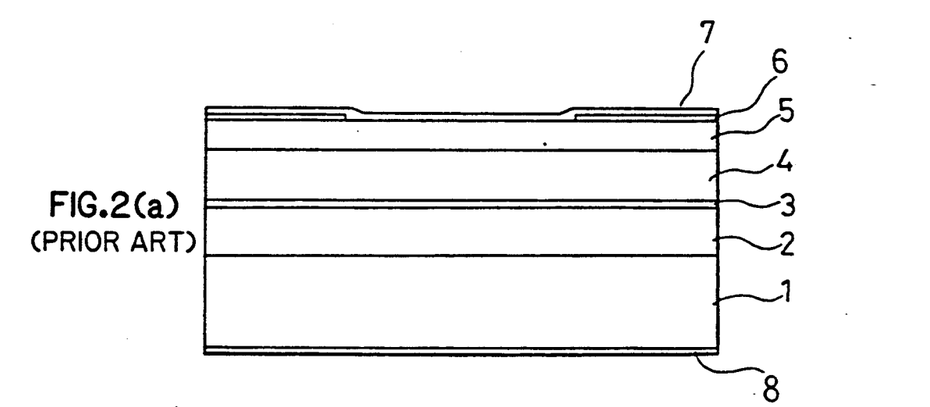
FIG. 2(a) is a diagram showing a semiconductor laser device and FIG. 2(b) shows the light intensity distribution of the active region of the laser according to the prior art.

FIG. 2(a) shows, in cross-section, a prior art broad-area type semiconductor laser device used as a light source for the excitation of a solid-state laser. In FIG. 2(a), denoted at 1 is a p type GaAs substrate. A p type $Al_{0.5}Ga_{0.5}As$ cladding layer 2 is disposed on the substrate 1. An undoped $Al_{0.1}Ga_{0.9}As$ active layer 3 is disposed on the p type cladding layer 2. An n type $Al_{0.5}Ga_{0.5}As$ cladding layer 4 is disposed on the active layer 3. An n type GaAs contact layer 5 is disposed on the n type cladding layer 4. A $SiO_2$ insulating film 6 is disposed on portions of the contact layer 5. An n side electrode 7 is disposed on the contact layer 5 and the insulating film 6, and a p side electrode 8 is disposed on the rear surface of the substrate 1.

Figure 2B:
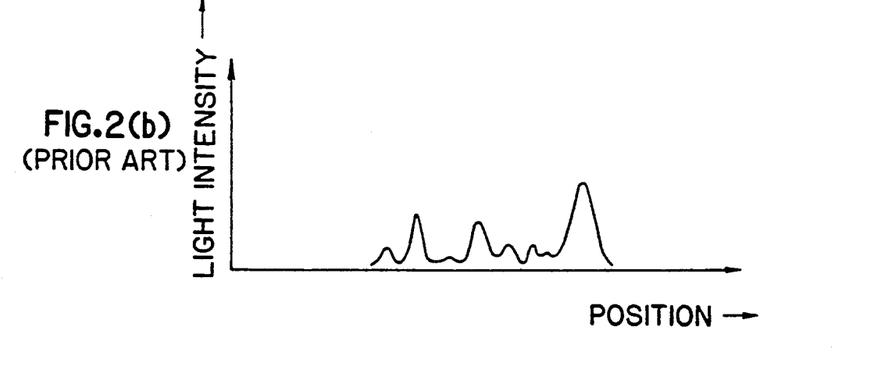

FIG. 2(b) is a diagram showing the light intensity distribution at the resonator facet during the oscillation of the broad-area type semiconductor laser.

In order to excite a solid-state laser, laser light emitted from a semiconductor laser device is required to be effectively irradiated a the solid-state laser crystal. When a side pumping type excitation is to be conducted, since a semiconductor laser device is arranged several millimeters from the solid-state laser rod in the transverse direction, the beam emitted from the semiconductor laser device need not be a single lobe, such as in a semiconductor laser device for use with an optical disc, but may have multiple lobes. Therefore, for exciting a solid-state laser, a broad-area type semiconductor laser device as shown in FIG. 2(a) which has high light output power, although the emitted laser beam does not have a single lobe, is often selected.

This structure is obtained by producing a current confinement mechanism including an insulating film 6 after one crystal growth step on the semiconductor substrate 1. This means that the production process is quite simplified.

This broad-area type semiconductor laser device will operate as follows.

When a positive voltage and a negative voltage are applied to the p side electrode 8 and the n side electrode 7 of the semiconductor laser device, respectively, a current flows in a forward direction with respect to the pn junction and electrons and holes are injected into the active layer 3. Since the energy band gap of the active layer 3 is smaller than those of the cladding layers 2 and 4, carriers are confined in the active layer 3. When the carrier density is increased by increasing the current, an induced emission arises, and when the current exceeds a certain threshold, a laser oscillation is started. Once the laser oscillation is started, laser light is emitted to the outside, where the laser output is linear with the current.

In a broad-area type semiconductor laser device shown in FIG. 2(a) since the current path is limited by the $SiO_2$ insulating film 6, the laser oscillation arises at the active layer region directly below an aperture portion of the $SiO_2$ film 6. In a broad-area type semiconductor laser device for exciting a solid-state laser, the aperture width of the $SiO_2$ film 6 is about 100 to 200 microns.

In the prior art broad-area type semiconductor laser device of such a construction, since there is no mechanism for confining laser light in a horizontal direction with respect to the substrate, local laser oscillation, i.e., a filamentation, is generated due to a slight non uniformities within the active layer. This filamentation causes the following drawbacks.

(1) The laser oscillating region changes along with an increase in current, and the near-field pattern, and in its turn, the far-field pattern changes.

(2) A region where laser oscillation does not occur even in the active layer region directly below the aperture portion of the $SiO_2$ film is generated. The current injected into this region turns into spontaneously emitted light and is again absorbed by the active layer increasing the laser temperature. This unfavourably enhances thermal saturation of the laser light output.

In general, the maximum light output power of the broad-area type semiconductor laser is determined by the thermal saturation, i.e., the phenomenon that the temperature of the active layer is increased carriers which do not contribute to the laser oscillation are increased, and at last the laser light output is saturated. Therefore, the above-mentioned drawback (2) becomes a great problem.

SUMMARY OF THE INVENTION

It is an object of the present invention to provide a broad-area type semiconductor laser device in which no filamentation occurs and the active layer region emits light uniformly.

It is another object of the present invention to provide a broad-area type semiconductor laser device in which no filamentation occurs and all the laser emissions in the active region are synchronized with each other.

It is still another object of the present invention to provide a broad-area type semiconductor laser device producing a laser beam in a fundamental mode.

Other objects and advantages of the present invention will become apparent from the detailed description given hereafter; it should be understood, however, that the detailed description and specific embodiment are given by way of illustration only, since various changes and modifications within the spirit and scope of the invention will become apparent to those skilled in the art from this detailed description.

According to a first aspect of the present invention, a broad-area type semiconductor laser device is provided with a low reflectance film on the entire surface of the front facet of the resonator and a plurality of high reflectance films provided at portions of the active region which are arranged parallel to each other and perpendicular to the active region width on the low reflectance film. Therefore, the laser oscillation occurs stably at a plurality of regions and filamentation is avoided.

According to a second aspect of the present invention, the intervals between the respective partial high reflectance films are below 10 microns in the above-described construction. Therefore, the laser light arising at the respective partial high reflectance films are synchronized with each other, thereby lowering the threshold current and producing single wavelength oscillation.

According to a third aspect of the present invention, the widths of the plurality of partial high reflectance films are set largest at a central portion of the active region and narrower approaching the sides at the active region. Therefore, a single lobe laser beam can be obtained.

DETAILED DESCRIPTION OF THE PREFERRED EMBODIMENT

An embodiment of the present invention will be described in detail with reference to the drawings.

Figure 1A:
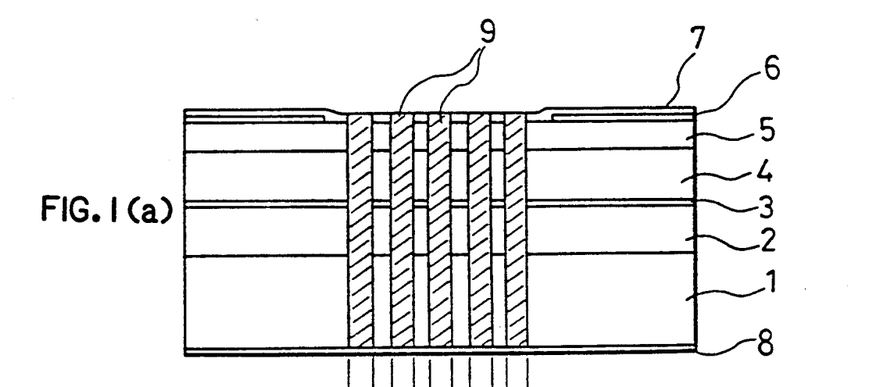
FIG. 1(a) is a diagram showing a semiconductor laser device and FIG. 1(b) shows the light intensity distribution of the active of the laser according to a first embodiment of the present invention.

FIG. 1(a) shows, in cross-section, a semiconductor laser device according to a first embodiment of the present invention. In FIG. 1(a), denoted at 1 is a p type GaAs substrate. A p type $Al_{0.5}Ga_{0.5}As$ cladding layer 2 is disposed on the substrate 1. An undoped $Al_{0.1}Ga_{0.9}As$ active layer 3 is disposed on the p type cladding layer 2. An n type $Al_{0.5}Ga_{0.5}As$ cladding layer 4 is disposed on the active layer 3. An n type GaAs contact layer 5 is disposed on the n type cladding layer 4. A $SiO_2$ insulating film 6 is disposed on portions of the contact layer 5. An n side electrode 7 is disposed on the contact layer 5 and the insulating film 6, and a p side electrode 8 is disposed on the rear surface of the substrate 1. A plurality of high reflectance films 9 are disposed on a region which is to be an active region at the facets of the semiconductor laser device. The width of the active region of the general broad-area type semiconductor laser is 100 to 200 microns.

Figure 1B:
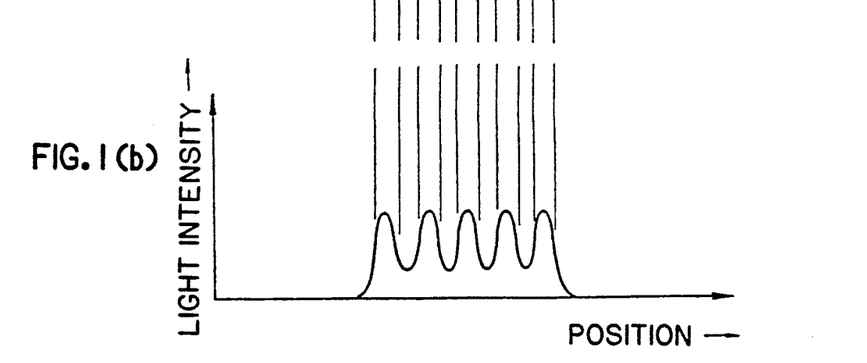
Figure 3:
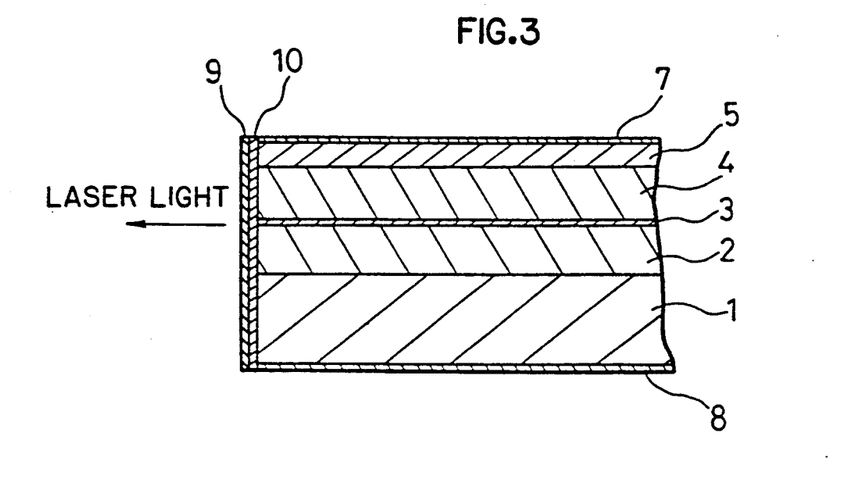
FIG. 3 is a cross-sectional view showing the neighborhood of a light emitting facet of a semiconductor laser device of the present invention.

FIG. 1(b) shows a light intensity distribution at the resonator facet during the oscillation of the semiconductor laser of FIG. 1(a). FIG. 3 shows a cross-sectional view at the neighborhood of the cavity facet of the semiconductor laser device shown in FIG. 1(a), which is obtained when the semiconductor laser device of FIG. 1(a) is cut in the advancing direction of the laser light at a region where the high reflectance films are produced. In FIG. 3, reference numeral 10 denotes a low reflectance film.

The production method of this semiconductor laser will be described.

Figure 5A:
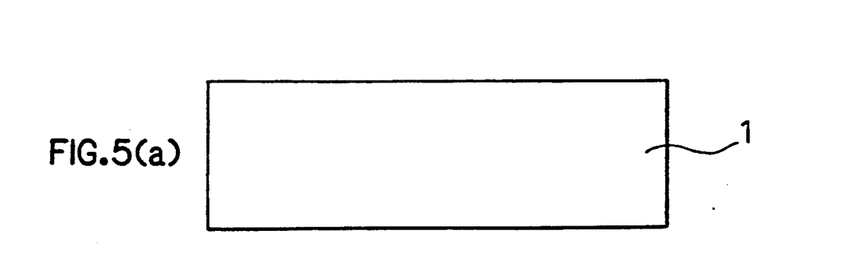
FIGS. 5(a)-5(d) are diagrams illustrating, a production method of a semiconductor laser device of the present invention
Figure 5B:
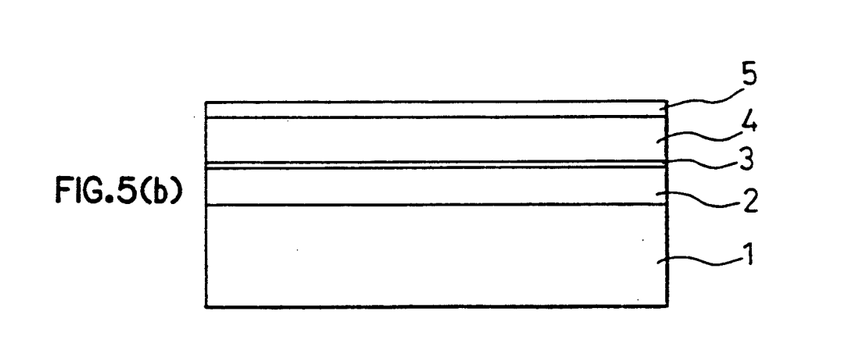

First of all, as shown in FIG. 5(b), a p type $Al_{0.5}Ga_{0.5}As$ cladding layer 2, an undoped $Al_{0.1}Ga_{0.9}As$ active layer 3, an n type $Al_{0.5}Ga_{0.5}As$ cladding layer 4, and an n type GaAs contact layer 5 are successively grown on the p type GaAs substrate 1 shown in FIG. 5(a) by an epitaxial growth method. As this epitaxial growth method, liquid phase epitaxy (LPE), vapor phase epitaxy (VPE), molecular beam epitaxy (MBE), or metal organic chemical vapor deposition (MOCVD) may be used. Among these, the MBE method or MO-CVD method has merit in that a good quality epitaxial growth layer is easily produced over a large area, with good reproducibility, and uniformity.

On a wafer where the epitaxial growth has concluded, a silicon dioxide insulating film 6 for current confinement is produced. As this production method, sputtering vapor deposition, electron beam vapor deposition, or thermal CVD may be employed. As insulating film, 6 a silicon nitride film ($SiN_x$) may be also used.

Figure 5C:
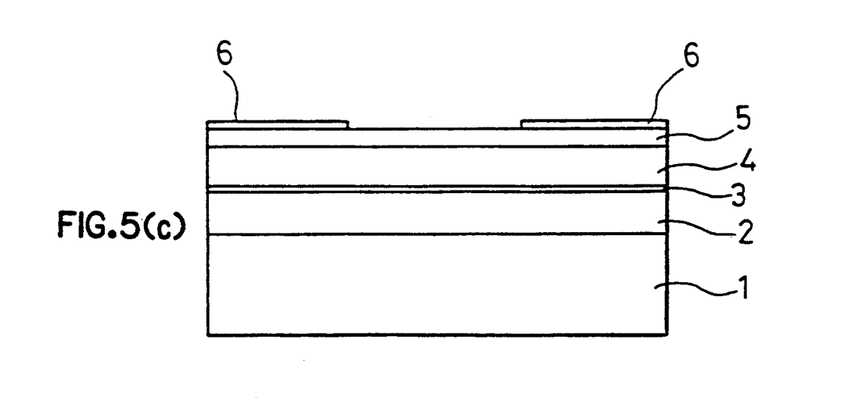

Next, a stripe aperture portion of required width for an active region (100 to 200 microns) is provided on the $SiO_2$ film 6. This is accomplished by a conventional photolithography technique and etching using hydrofluoric acid solution for etching the $SiO_2$ film 6. FIG. 5(c) shows a cross-sectional view of the laser device viewed in the direction perpendicular to the aperture after this process is concluded.

An n side electrode 7 is produced on the upper surface of this wafer, i.e., on the side where the epitaxial growth layers are produced, and a p side electrode 8 is produced on the opposite side on the p type GaAs substrate 1. Thus, the processing of the wafer is concluded.

Figure 5D:
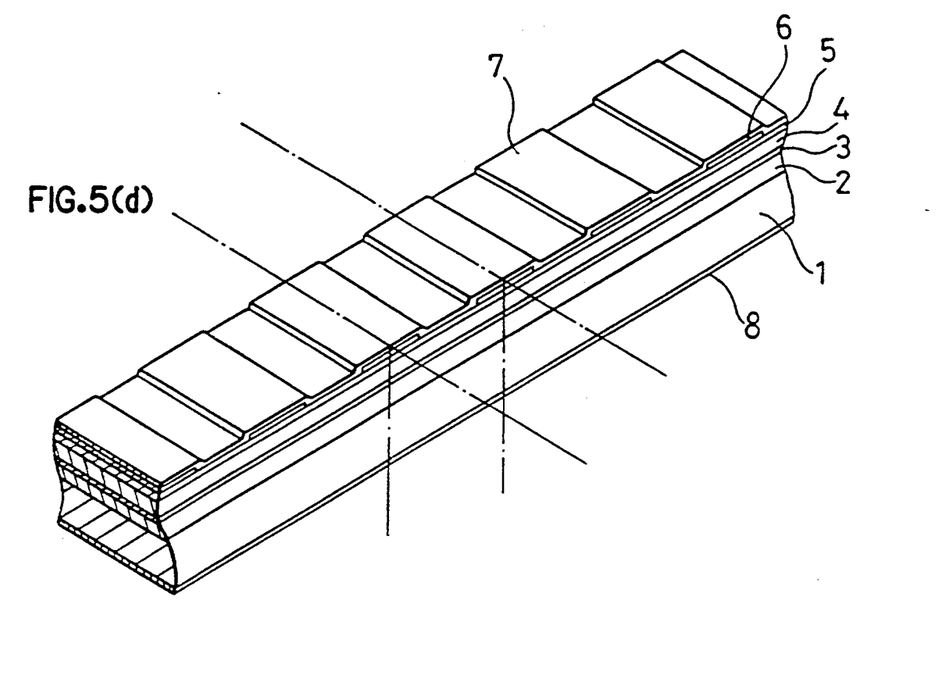

Next, bars of 100 to 1500 microns width are cut by cleavages. The cleaving planes of the respective bars become resonator facets of the laser device because they are flat at the atom level. FIG. 5(d) shows a perspective view of the bar after being cut out.

Figure 5E:
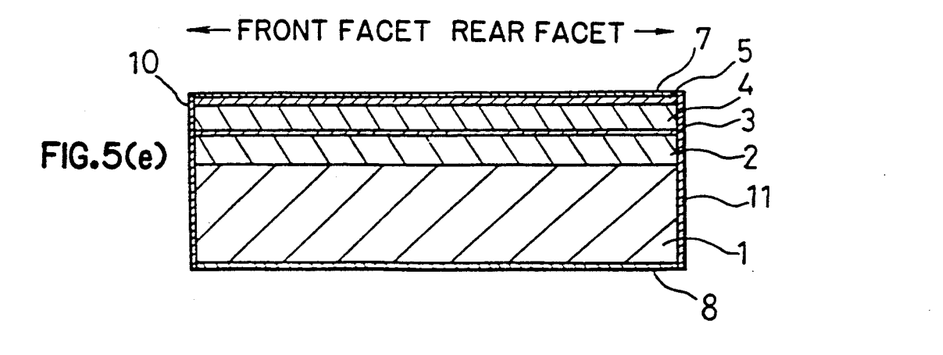
FIG. 5(e) is a cross-sectional view of the semiconductor laser produced.

Among the cleavage ends of these bars, a high reflectance film 11 is produced at the side which becomes a rear facet of the laser resonator and a low reflectance film 10 is produced at the front facet which becomes the light emitting facet. FIG. 5(e) shows a cross-section in this case. As material of the reflective film, silicon dioxide film ($SiO_2$), silicon nitride film ($SiN_x$), $Al_2O_3$, or amorphous silicon may be used. In order to obtain a predetermined reflectivity, a multilayer film coating comprising a plurality of materials is used. The reflectance of the low reflective film 10 is generally 0 to 15% and the reflectivity of the high reflectance film 11 at the rear facet is generally 80 to 100%.

The production method of the high reflectance films will be described.

Figure 5F:
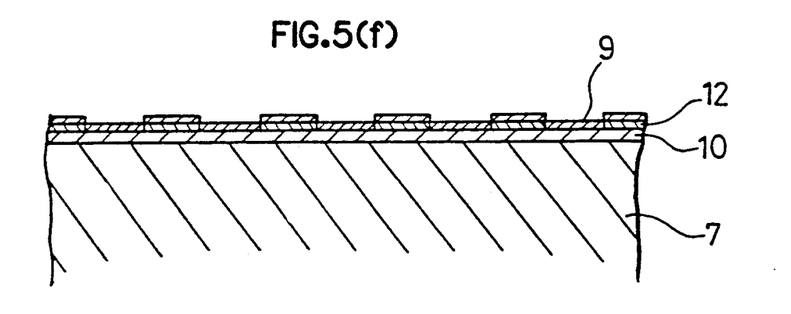
FIGS. 5(f) and 5(g) illustrate alternative methods of forming reflection film stripes on a facet of a semiconductor laser according to an embodiment of the present invention.

FIG. 5(f) shows a first method for producing the high reflectance films. In this first method, first of all, a resist film 12 is applied to the facet after the low reflectance film 10 is produced. Thereafter, apertures whose widths are approximately equal to those of the high reflectance films 9 are provided at places which are to be high reflectance films by a photolithography technique. A reflective film of material and layer construction corresponding to those of the high reflectance films 9 is produced. The figure shows the bars at this stage viewed from above. These bars are immersed in a resist solvent and the photoresist film is dissolved. Then, the high reflectance films produced on the photoresist film 12 are removed together, thereby leaving the high reflectance films 9. This is a so-called lift-off method. The bars at which partially high reflective films 9 are thus produced are separated into elements and diebonded onto a heatsink, and wires are bonded onto the upper surface electrodes, thereby completing an element.

Figure 5G:
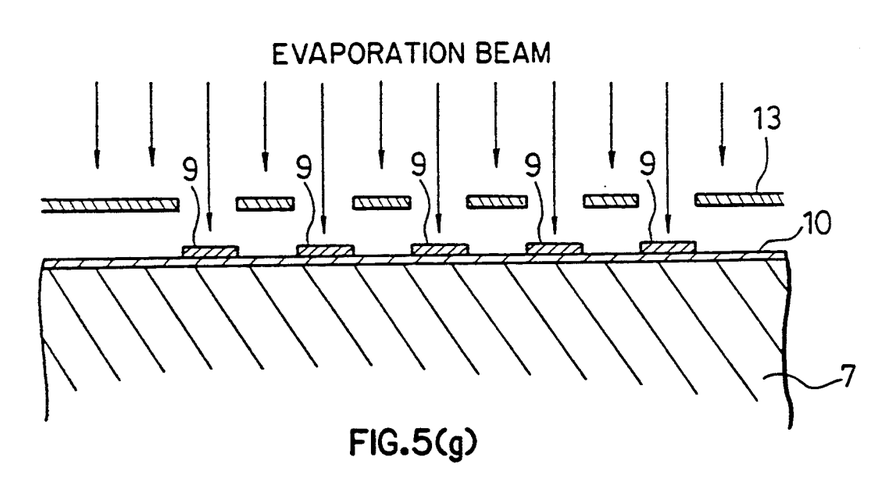

FIG. 5(g) shows a second method for producing the partially high reflective films. In this second method, an evaporation mask is used in place of the lift-off method. As shown in FIG. 5(g), a metal evaporation mask 13 and having aperture portions corresponding to the widths of the high reflectance films 9 at the front face of the entire surface of the resonator facet of the bar is used, thereby producing high reflectance films 9. The processes after producing the high reflectance films 9 are the same as those of the above-described embodiment.

The semiconductor laser device of this embodiment will operate as follows.

The gain of the semiconductor laser is generally represented by the following formula $$g = \alpha + \frac{1}{2L} \ln\left(\frac{1}{Rf} \cdot \frac{1}{Rr}\right) \tag{1}$$

where g is gain, $\alpha$ is loss, Rf is facet reflectivity of the front facet, Rr is facet reflectivity of the rear facet, and L is a cavity length. From the formula (1), the gain g decreases as the front facet reflectivity Rf increases. The fact that the gain g decreases means that the oscillation threshold current is lowered, i.e., laser oscillation becomes easier. Reversely, the gain g increases as the front facet reflectivity Rr is lowered, whereby laser oscillation becomes more difficult. The front cavity facet of the semiconductor laser device of the present invention is provided with high reflectance films 9 after being coated with a low reflectance film 10. Accordingly, laser oscillations arise with the high reflectance films 9 as their centers. When the current is increased after the laser oscillation is started, the intensity distribution of the laser light is kept stable at the regions of the respective high reflectance films 9. That is, the near field pattern (NFP) is kept stable.

Herein, when the widths of the high reflectance films 9 are below 40 microns in the semiconductor laser device of FIG. 1, the configuration of the laser beams in the transverse direction with respect to the active layer, which are emitted from the regions of the respective high reflectance films are of a single lobe. In this embodiment, the width is about 20 microns.

The laser light intensity distribution has a configuration corresponding to the high reflectance films 9 in the neighborhood of the cavity facet. However, the component reflected into the inside of the semiconductor laser device by the high reflectance films 9 advances to the rear facet without broadening. Therefore, even inside the semiconductor laser device, a laser light intensity distribution having a configuration corresponding to the high reflectance films 9 is obtained similarly as at the laser facet portion. When the intervals between the high reflectance films 9 are appropriately established, that is, below 50 microns, the current injected into the semiconductor laser device is effectively converted into laser light without becoming spontaneously emitted light at the non laser oscillation regions.

In another embodiment of the present invention in which the intervals between the high reflectance films 9 are below 10 microns, the laser light generated at the high reflectance reflective films 9 interacts and synchronizes with each other. When the laser lights are synchronized, the threshold current is lowered or a single wavelength oscillation is obtained. The efficiency of the laser light absorption of the solid-state laser largely depends on the wavelength of the laser light. When the wavelength deviated by about 1 to 2 nm from the peak wavelength of light absorption, the absorption efficiency is greatly reduced. Accordingly, the laser light generated at the respective high reflectance films are synchronized, and the laser light of this embodiment which has become of a single wavelength is quite effective for the excitation of solid-state laser device.

Figure 4:
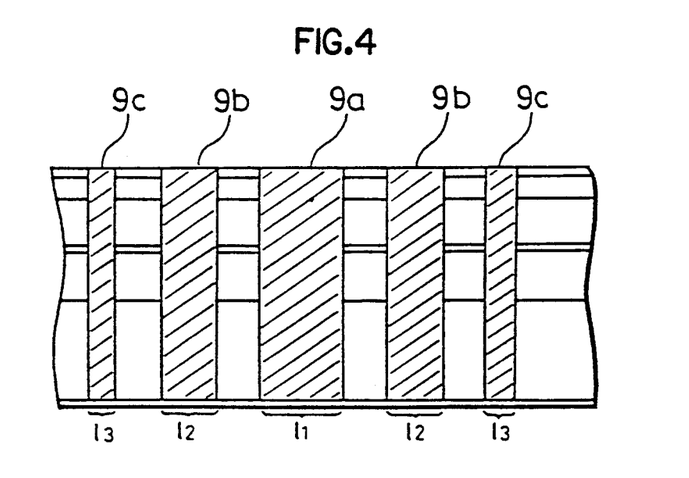
FIG. 4 is a diagram showing a semiconductor laser device according to a second embodiment of the present invention.

FIG. 4 shows a facet portion of a semiconductor laser device according to a second embodiment of the present invention. In this embodiment, as shown in the figure, the width $l_1$ of the central high reflectance film 9a is largest and the width is gradually reduced as shown by the width $l_2$ of the film pairs 9b and the width $l_3$ of the film pairs 9c disposed on opposite sides of the central film 9a. When there is a relation $l_1 > l_2 > l_3$, the gain of the central portion becomes largest and the gain is gradually reduced in the directions away from the central portion. Thus, a mode of laser light broadening in a single lobe over the entirety of the broad area will occur. The laser light emitted from such a semiconductor laser device becomes approximately a single lobe configuration in the horizontal and vertical directions of the active layer at a distance of a single wavelength. That is, it is an ideal laser light. Such laser light can be easily collimated by a lens, and therefore, a variety of applications such as for optical disks, for mechanical processing, for optical communication, and not only for solid-state laser excitation can be achieved.

While in the above-illustrated embodiment AlGaAs series semiconductor laser devices are described, the present invention can be applied to the laser devices of other III-V group semiconductor materials such as AlGaInP or InGaAsP with the same effects as described above.

As is evident from the foregoing description, according to a first aspect of the present invention, a plurality of high reflectance films are arranged at the active region in parallel with each other perpendicular to the active region width direction on the cavity front facet of a broad area type semiconductor laser device. Therefore, a semiconductor laser device in which the active layer emits light uniformly without filamentation is obtained.

According to a second aspect of the present invention, since the intervals between the high reflectance films are below 10 microns in the above-described construction, the laser light oscillations arising at the respective high reflectance films are synchronized with each other, thereby lowering the threshold current and producing a single wavelength oscillation.

According to a third aspect of the present invention, the widths of the plurality of high reflectance films are made such that the width of the film provided at the central portion of the active region is largest and the other widths become narrower as they move away from the central film. Therefore, a single lobe laser beam can be obtained, thereby enabling applications to a variety of ranges of fields.

What is claimed is:

1. A semiconductor laser device oscillating at a wavelength $\lambda$ comprising:

a first conductivity type semiconductor substrate;

a first conductivity type cladding layer, a planar active layer, a second conductivity type cladding layer, and a second conductivity type contact layer successively disposed on said semiconductor substrate;

a first electrode directly disposed on a width of said contact layer thereby defining a current path width through said active layer;

a second electrode disposed on said semiconductor substrate;

first and second opposed facets for transmitting and reflecting light and disposed transverse to said cladding layers and said planar active layer;

a first reflection film having a reflectivity $R_1$ at a wavelength $\lambda$ and disposed on the first facet;

a plurality of generally parallel reflection film stripes disposed transverse to said planar active layer at spaced apart locations on said first reflection film within said current path width, each reflection film stripe having a reflectivity $R_2$ higher than the reflectivity $R_1$ at the wavelength $\lambda$; and a second reflection film having a reflectivity $R_3$ higher than the reflectivity $R_1$ at the wavelength $\lambda$ and disposed on the second facet.

2. A semiconductor laser device as defined in claim 1 wherein each of the generally parallel reflection film stripes is generally perpendicular to the planar active layer and has a width along said planar active layer, wherein the widths of the stripes are substantially equal, and the stripes are spaced at substantially equal intervals.

3. A semiconductor laser device as defined in claim 2 wherein the interval between adjacent stripes is less than 10 microns.

4. A semiconductor laser device as defined in claim 1 wherein said first reflection film and said reflection film stripes comprise a single layer dielectric film.

5. A semiconductor laser device as defined in claim 1 wherein each of the reflection film stripes is generally perpendicular to said planar active layer and has a width along said planar active layer, wherein the width of a central stripe is $l_1$, the widths of the stripes adjacent to the central stripe are $l_2$, and the width of N-th stripe from the central stripe is $l_N$ and $l_1 > l_2 > \ldots l_N$.

6. A semiconductor laser device oscillating at a wavelength $\lambda$ comprising:

a first conductivity type semiconductor substrate;

a first conductivity type cladding layer, an active layer, a second conductivity type cladding layer, and a second conductivity type contact layer successively disposed on said semiconductor substrate;

an insulating film having a stripe-shaped aperture and disposed on said contact layer;

a first electrode disposed on said insulating film and on said contact layer in said aperture thereby defining a current path width through said active layer;

a second electrode disposed on said semiconductor substrate;

first and second opposed facets for transmitting and reflecting light and disposed transverse to said cladding layers and said active layer;

a first reflection film having a reflectivity $R_1$ at a wavelength $\lambda$ and disposed on the first facet;

a plurality of reflection film stripes disposed at spaced apart locations on said first reflection film within said current path width, generally perpendicular to and crossing said active layer, opposite the aperture in said insulating film where said each reflection film stripe having a reflectivity $R_2$ at the wavelength $\lambda$, where $R_2$ is higher that $R_1$; and a second reflection film having a reflectivity $R_3$ higher than the reflectivity $R_1$ at the wavelength $\lambda$ and disposed on the second facet.

7. A semiconductor laser device as defined in claim 1 wherein at least one of said first reflection film and said reflection film stripes comprises a multi-layer dielectric film.

8. A semiconductor laser device as defined in claim 6 wherein at least one of said first reflection film and said reflection film stripes comprises a multi-layer dielectric film.

9. A semiconductor laser device as defined in claim 6 wherein at least one of said first reflection film and said reflection film stripes comprises a single layer dielectric film.

10. A semiconductor laser device as defined in claim 6 wherein each of the reflection film stripes is generally perpendicular to said active layer and has a width along said active layer, wherein the width of a central stripe is $l_1$, the widths of the stripes adjacent to the central stripe are $l_2$, and the width of N-th stripe from the central stripe is $l_N$ and $l_1 > l_2 > \ldots l_N$.

11. A semiconductor laser device as defined in claim 6 wherein the interval between adjacent reflection film stripes is less than 10 microns.

* * * * *